(12) United States Patent
Tezuka (10) Patent No.: US 6,219,816 B1
(45) Date of Patent: Apr. 17, 2001

(54) DEVICE AND METHOD FOR CARRYING OUT REED-SOLOMON ENCODING

(75) Inventor: Hiroshi Tezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/181,650

(22) Filed: Oct. 29, 1998

(30) Foreign Application Priority Data

Oct. 29, 1997 (JP) .................................................. 9-296966

(51) Int. Cl.$^7$ .................................................. H03M 13/00

(52) U.S. Cl. ........................................... 714/784; 714/752

(58) Field of Search .................................... 714/752, 784, 714/781, 757; 708/492, 313

(56) References Cited

U.S. PATENT DOCUMENTS

| 4,413,339 | * | 11/1983 | Riggle et al. | 714/765 |
|---|---|---|---|---|
| 4,555,784 | * | 11/1985 | Wood | 714/785 |
| 4,998,252 | * | 3/1991 | Suzuki et al. | 714/752 |
| 5,471,485 | * | 11/1995 | Tong | 714/757 |
| 5,490,154 | * | 2/1996 | Mester | 714/784 |
| 5,574,717 | * | 11/1996 | Tomizawa et al. | 370/244 |
| 5,754,563 | * | 5/1998 | White | 714/757 |
| 5,757,826 |   | 5/1998 | Fredrickson | 714/784 |
| 5,883,907 | * | 3/1999 | Hoekstra | 714/784 |
| 5,943,348 | * | 8/1999 | Ly | 714/761 |
| 6,079,041 | * | 6/2000 | Kunisa et al. | 714/752 |

FOREIGN PATENT DOCUMENTS

| 59-226951 | 12/1984 | (JP) | G06F/11/10 |
|---|---|---|---|
| 60-73752 | 4/1985 | (JP) | G06F/11/10 |
| 9-36753 | 3/1997 | (JP) | H03M/13/00 |

OTHER PUBLICATIONS

H. Imai, "Essence of Error Correction Encoding Technique", Japan Industrial Technology Center, p. 30, (1986).
K. Iwamura et al., "A Construction Method for Reed–Solomon Codec Suitable for VLSI Design", Proc. Inst. Elec., Info., Comm. Eng. of Japan, vol. J71–A pp. 751–759, 1988.
Nordstrom (I/O Interfacing for the Transputer. IEEE, Mar. 1991).*
He et al (on the Application of Turbo Codes to the Robust Transmission of Compressed Images. IEEE, Oct. 1997).*
Chattopadhyay et al (Parallel Decoder for Cellular Automata Based Byte Error Correcting Code. IEEE, Jan. 1997).*
Dabiri et al (Fast Parallel Algorithms for Decoding Reed–Solomon Codes. IEEE, Jul. 1994).*
Dabiri et al (Fast Parallel Algorithms for Decoding Reed–Solomon Codes Based on Remainder Polynomials. IEEE, Jul. 1995).*

* cited by examiner

Primary Examiner—Albert Decady
Assistant Examiner—Guy Lamarre
(74) Attorney, Agent, or Firm—Foley & Lardner (57) ABSTRACT

In a Reed-Solomon encoding device which produces, for example, a Reed-Solomon code of 4 bytes for a data signal of 16 bytes, the Reed-Solomon encoding device includes a signal separating circuit (100) which separates the input signal into two signals A and B which are successively outputted in a time division fashion. In synchronism with the output of these signals, an octal counter (1) is counted up. In response to the two separated signals outputted from the signal separating circuit (100), coefficients of respective terms of a remainder obtained by dividing the data signal by a generator polynomial are classified into even-number order ones and odd-number order ones to be calculated in parallel. The even-number order coefficients and the odd-number order coefficients are supplied to selectors (2) and (3) as signals C and D, respectively. The selectors (2) and (3) output the signals from the signal separating circuit (100) when the counter (1) has a count value between 0 and 5 and the signals C and D when the count value is 6 or 7.

13 Claims, 6 Drawing Sheets

DEVICE AND METHOD FOR CARRYING OUT REED-SOLOMON ENCODING

BACKGROUND OF THE INVENTION

This invention relates to a Reed-Solomon encoding device and method and, in particular, to such device and method adapted to error correction of a desired number of blocks not fewer than two.

In data communication, a redundancy signal is generally appended to data (information signal) to be transmitted so that a data error occurring in a transmission path can be detected and corrected at a receiving end. As the redundancy signal to be appended to the information signal, a Reed-Solomon code is widely known.

Examples of a device for carrying out Reed-Solomon encoding are disclosed in Japanese Unexamined Patent Publications (JP-A) Nos. 59-226951 (226951/1984), 60-73752 (73752/1985), and 9-36753 (36753/1997). However, each of these publications discloses no more than a Reed-Solomon encoding device adapted to error correction of a single block or two blocks at most.

In contrast, as a Reed-Solomon encoding circuit adapted to error correction of a desired number of blocks not fewer than two, a circuit using a polynomial division circuit is disclosed in "Essence of Error Correction Encoding Technique" (supervised by Hideki Imai, Japan Industrial Technology Center, 1986), page 30 (hereinafter called a conventional example 1). In addition, a circuit for successively processing input signals in a systolic array structure is disclosed in "A Construction Method for Reed-Solomon Codec Suitable for VLSI Design" (Proceedings of Institute of Electronics, Information, Communication Engineers of Japan, Vol. J71-A, pp. 751–759) (hereinafter called a conventional example 2).

Figure 1:
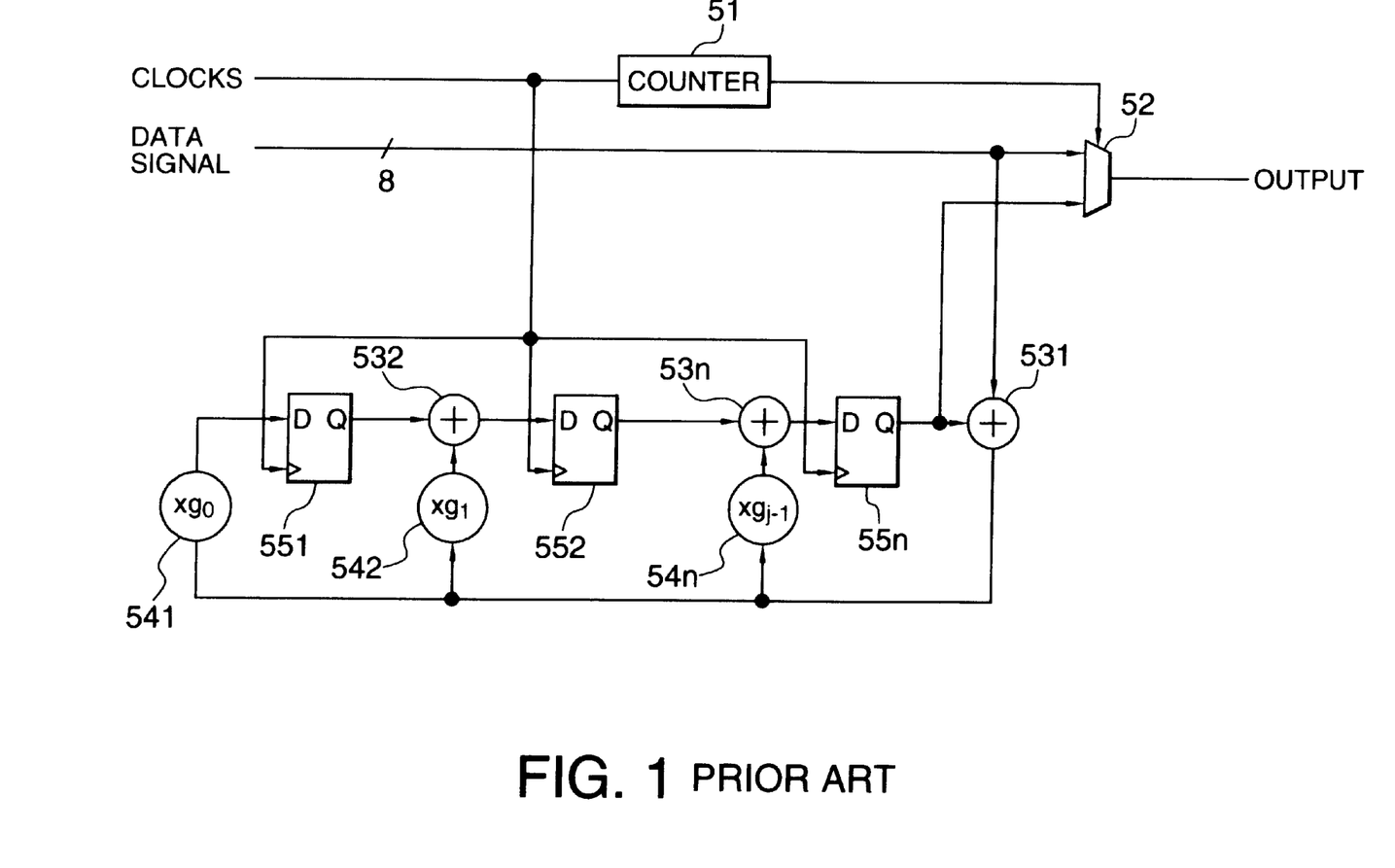
FIG. 1 is a block diagram showing a structure of a first conventional Reed-Solomon encoding circuit.

FIG. 1 is a block diagram showing a structure of the Reed-Solomon encoding circuit in the conventional example 1.

The Reed-Solomon encoding circuit of the conventional example 1 comprises a division circuit which is composed of exclusive-OR circuits 531 through 53n, Galois field multiplication circuits 541 through 54n, and D flop-flops 551 through 55n, and which calculates a formula obtained by dividing a polynomial corresponding to an input signal by a generator polynomial. Note that multipliers of the Galois field multiplication circuits 541 through 54n are determined from coefficients of the generator polynomial F(x) represented by Equation (1).

$$F(x)=(x+\alpha)(x+\alpha^2)(x+\alpha^3)\ldots(x+\alpha^m) \quad (1)$$

In the above-mentioned Reed-Solomon encoding circuit, a selector 52 is responsive to a count value of a counter 51 and selects either the input information signal or an output signal of the D flop—flop 55n as a selector output. Thus, the selector 52 successively outputs the information signal and a Reed-Solomon code as a redundancy code. Herein, by controlling which one is to be outputted from the selector 52 with reference to the count value of the counter 51, it is possible to produce the Reed-Solomon code permitting error correction of a desired number of blocks.

Figure 2:
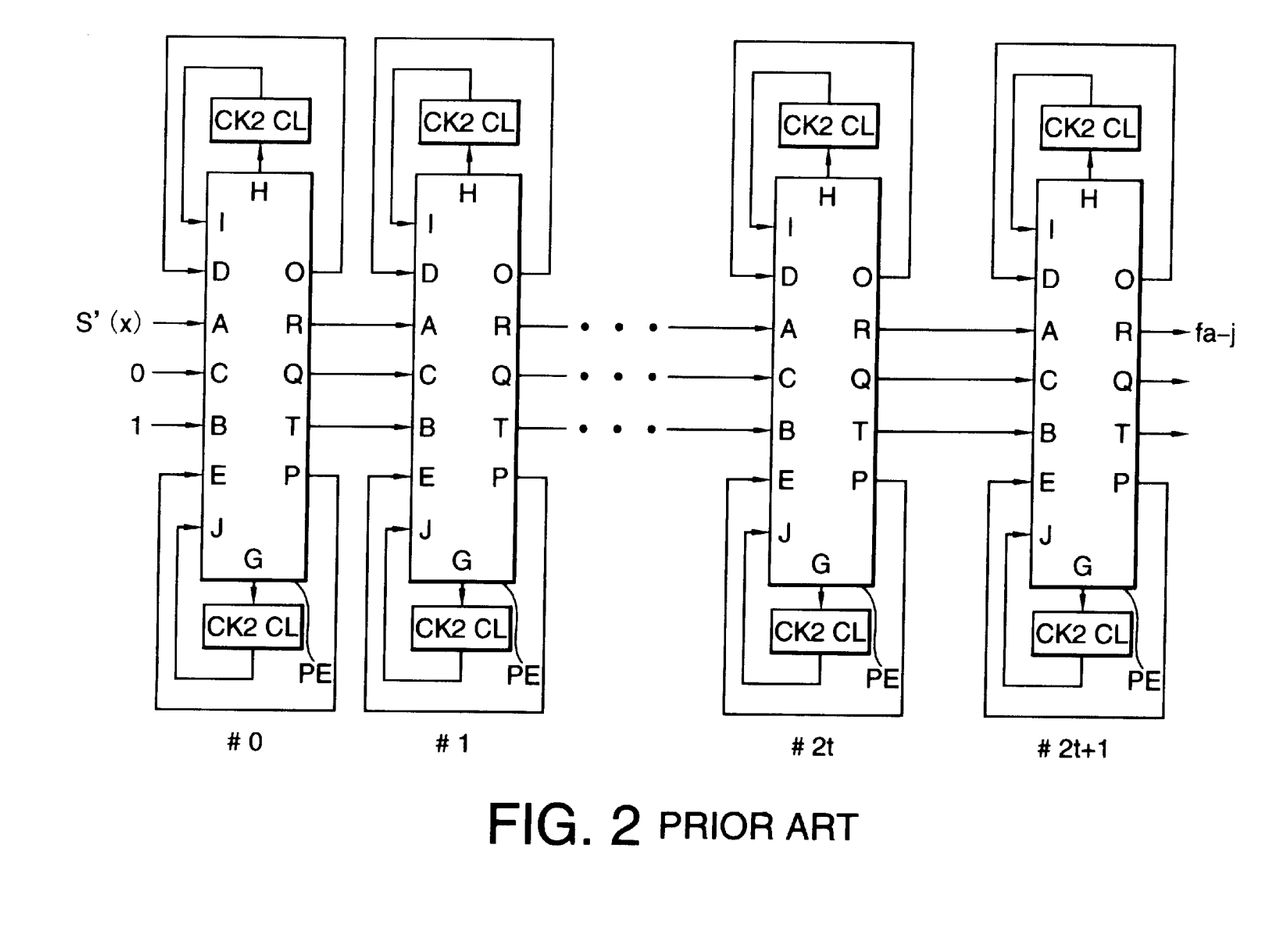
FIG. 2 is a block diagram showing a structure of a second conventional Reed-Solomon encoding circuit.

FIG. 2 is a block diagram showing a structure of the Reed-Solomon encoding circuit in the conventional example 2.

Figure 3:
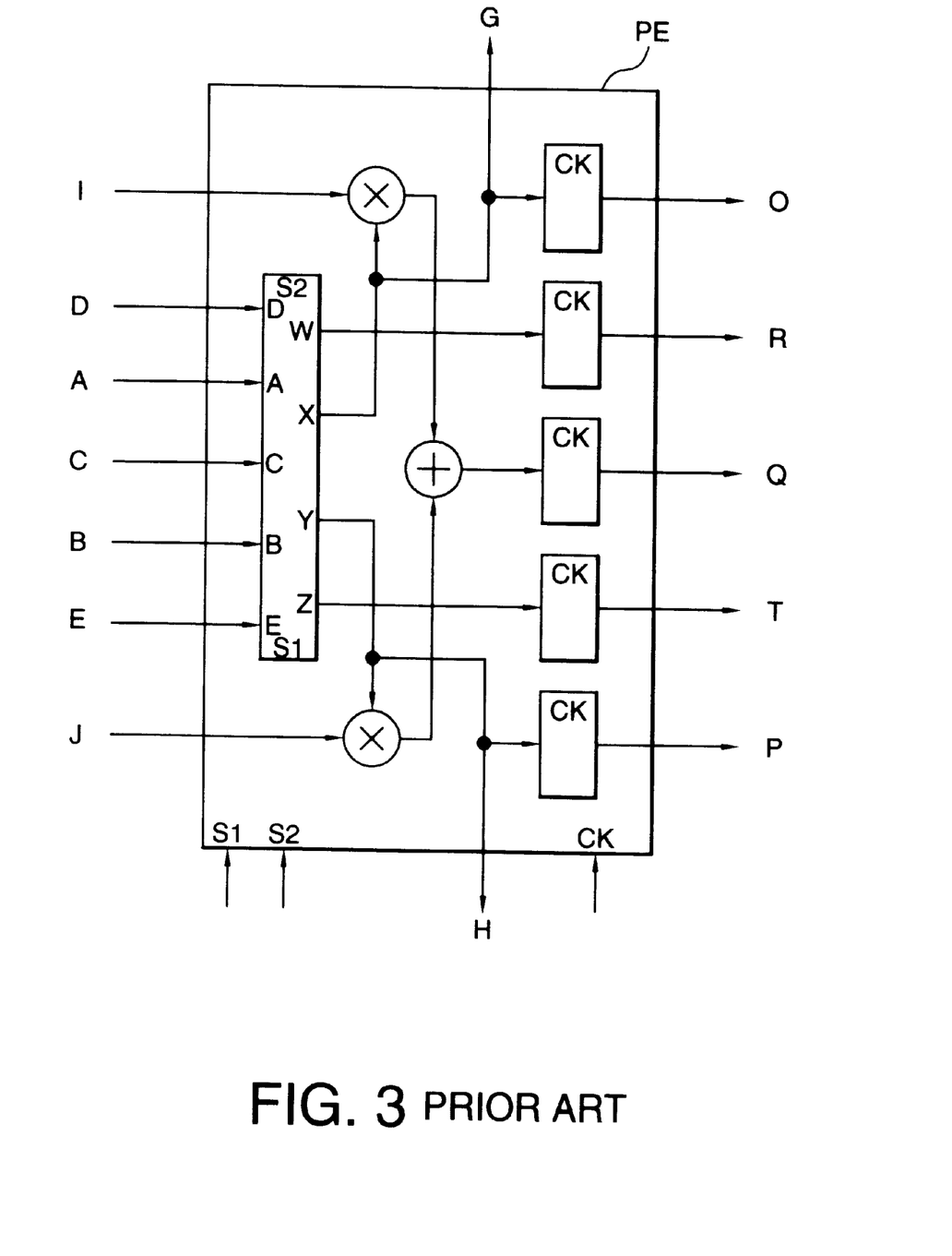
FIG. 3 is a view showing a structure of a PE in FIG. 2.

As illustrated in the figure, the Reed-Solomon encoding circuit in the convention example 2 comprises a division circuit formed by connecting in cascade a plurality of processing elements PE illustrated in FIG. 3, instead of the division circuit composed of the exclusive-OR circuits 531 through 53n, the Galois field multiplication circuits 541 through 54n, and the D flop-flops 551 through 55n illustrated in FIG. 1.

However, in each of the circuits in the conventional examples 1 and 2, the information signal is supplied one byte by one byte. Every time when the information signal is supplied, orders or degrees are lowered by one at a time. After completion of input of the information signal, redundancy signals corresponding to respective terms of a remainder polynomial as a result of calculation are successively outputted. Therefore, it takes a long time before completion of the Reed-Solomon encoding.

SUMMARY OF THE INVENTION

It is therefore an object of this invention to provide a Reed-Solomon encoding device and method adapted to error correction of a desired number of blocks not fewer than two and capable of carrying out high-speed encoding by parallel processing.

According to a first aspect of this invention, there is provided a Reed-Solomon encoding device which is supplied with an input signal containing N data signal blocks in each single frame for carrying out a division of dividing by a generator polynomial a polynomial corresponding to the input data signal to produce K redundancy signal blocks corresponding to a remainder obtained by the division and which comprises:

signal output means for outputting the N data signal blocks by J blocks at a time in a time division fashion successively from those corresponding to higher orders in the corresponding polynomial;

adder means, J in number, for calculating, with respect to J data signal blocks outputted from the signal output means and J calculated blocks obtained by a predetermined operation based upon J preceding data signal blocks outputted from the signal output means at a preceding timing, a sum of a pair of the data signal and the calculated blocks corresponding in their orders to each other;

operating means, J in number, responsive to J sum blocks calculated by the J adder means, respectively, for carrying out the predetermined operation to produce the J calculated blocks which correspond to orders lower by J levels than those of the J sum blocks calculated by the J adder means, respectively, and which are supplied to the J adder means, respectively; and selective output means, J in number, for outputting (N÷J) times J data signal blocks supplied from the signal output means and subsequently outputting (K÷J) times J calculated blocks produced by the J operating means;

N, K, and J being natural numbers where J is a measure (or a divisor) of both of N and K.

With the above-mentioned Reed-Solomon encoding device, it is possible to process the data signal by J blocks at a time in parallel and to produce K redundancy signal blocks successively by J blocks at a time. It is therefore possible to perform high-speed processing as fast as J times as compared with the conventional Reed-Solomon encoding device. Furthermore, as far as N, K, and J are natural numbers where J is a measure of both of N and K, the Reed-Solomon encoding device is capable of producing a Reed-Solomon code permitting error correction even in K is equal to 4 or more, i.e., permitting multiple error correction more than triple error correction.

The Reed-Solomon encoding device according to the first aspect may further comprise:

$((N+K)\div J)$-ary counting means for counting up at an interval equal to that of output timings of the data signal blocks from the signal output means. In this event:
the J selective output means successively output J data signal blocks supplied from the signal output means when the count value of the counting means is between 0 and $(N\div J-1)$ and successively output J calculated blocks produced by the J operating means when the count value of the counting means is between $(N\div J)$ and $((N+K)\div J-1)$.

According to a second aspect of this invention, there is provided a Reed-Solomon encoding device which is supplied with an input signal containing N data signal blocks in each single frame for carrying out a division of dividing by a generator polynomial a polynomial corresponding to the input data signal to produce K redundancy signal blocks corresponding to a remainder obtained by the division and which comprises:

auxiliary block appending means for appending I auxiliary blocks to the N data signal blocks;

signal output means for outputting the (N+I) data signal blocks, including the auxiliary blocks appended by the auxiliary block appending means, by J blocks at a time in a time division fashion successibley from those corresponding to higher orders in the corresponding polynomial;

adder means, J in number, for calculating, with respect to J data signal blocks outputted from the signal output means and J calculated blocks obtained by a predetermined operation based upon J preceding data signal blocks outputted from the signal output means at a preceding timing, a sum of a pair of the data signal and the calculated blocks corresponding in their orders to each other;

operating means, J in number, responsive to J sum blocks calculated by the J adder means, respectively, for carrying out the predetermined operation to produce the J calculated blocks which correspond to orders lover by J levels than those of the J sum blocks calculated by the J adder means, respectively, and which are supplied to the J adder means, respectively; and selective output means, J in number, for outputting $((N+I)\div J)$ times J data single blocks supplied from the signal output means and subsequently outputting $(K\div J)$ times J calculated blocks produced by the J operating means;

N, K, J, and I being natural numbers where J is a measure of both of (N+1) and K.

According to the above-mentioned Reed-Solomon encoding device, the I auxiliary blocks are appended to the N data signal blocks. The redundancy signal blocks are produced for the (N+I) data signal blocks in total, including the auxiliary blocks appended thereto. Thus, the device is applicable even if N can not be divided by J without a remainder. It is possible to process the (N+I) data signal blocks by J blocks at a time in parallel and to produce K redundancy signal blocks successibley by J blocks at a time. It is therefore possible to perform high-speed processing as fast as J times as compared with the convention Reed-Solomon encoding device. Furthermore, as far as N, K, and J are natural number where J is a measure of both of (N+I) and K and I is smaller than J, the Reed-Solomon encoding device is capable of producing a Reed-Solomon code permitting error correction even if K is equal to 4 or more, i.e., permitting multiple error correction more than triple error correction.

The Reed-Solomon encoding device according to the second aspect may further comprise:

$((N+K)\div J)$-ary counting means for counting up at an interval equal to that of output timings of the data signal blocks from the signal output means. In this event:
the J selective output means successively output J data signal blocks supplied from the signal output means when the count value of the counting means is between 0 and $((N+I)\div J-1)$ and successively output J calculated blocks produced by the J operating means when the count value of the counting means is between $((N+I)\div J)$ and $((N+I+K)\div J-1)$.

In the Reed-Solomon encoding device according to the second aspect:
each of the I auxiliary blocks may comprise a bit string of "0".

Advantageously, the signal output means at first outputs the I auxiliary blocks as higher-order ones than the N data signal blocks.

Thus, the highest-order term in the polynomial has a coefficient equal to 0 and is therefore excluded from error correction by the Reed-Solomon code produced.

In each of the Reed-Solomon encoding device according to the first and the second aspects, for example:
each of the J operating means executes the predetermined operation upon coefficients of such terms in the correspond polynomial that remainders equal to one another are produced when their orders are divided by J; and
each of the J adder means calculates, with respect to the calculated blocks as a result of the operation by the J operating means and the J data signal blocks outputted from the signal output means, a sum of a pair of the calculated and the data signal blocks equal in their orders in the corresponding polynomial to each other.

In this event, each of the J operating means may comprise receiving means for receiving another calculated block which corresponds to the order of the calculated block calculated by this operating means and which is produced as a result of the operation by any operating means other than this operating means, and operating means for carrying out the predetermined operation by the use of the above-mentioned another calculated block received by the receiving means.

In each of the Reed-Solomon encoding device according to the first and the second aspects, for example:
the signal output means produces a bit string of "0" when the J selective output means output the J sum blocks as a result of the addition by the J adder means.

According to a third aspect of this invention, there is provided a Reed-Solomon encoding method which is supplied with an input signal containing N data signal blocks in each single frame for carrying out a division of dividing by a generator polynomial a polynomial corresponding to the input data signal to produce K redundancy signal blocks corresponding to a remainder obtained by the division, the method comprising:

a signal output step of outputting the N data signal blocks by J blocks at a time in a time division fashion successively from those corresponding to higher orders in the corresponding polynomial;

an adding step of calculating, with respect to J data signal blocks outputted in the signal output step and J calculated blocks obtained by a predetermined operation based upon J preceding data signal blocks outputted in the signal output step at a preceding timing, a sum of a pair of the data signal and the calculated blocks corresponding in their orders to each other to produce J sum blocks; and an operating step of carrying out, in response to the J sum blocks calculated in the adding step, the predetermined operation to produce the J calculated blocks which correspond to orders lower by J levels than those of the sum blocks calculated in the adding step and which are respectively added in the adding step at a next timing;

N, K, and J being natural numbers where J is a measure of both of N and K.

According to a fourth aspect of this invention, there is provided a Reed-Solomon encoding method which is supplied with an input signal containing N data signal blocks in each single frame for carrying out a division of dividing by a generator polynomial a polynomial corresponding to the input data signal to produce K redundancy signal blocks corresponding to a remainder obtained by the division, the method comprising:

an auxiliary signal appending step of appending I auxiliary blocks to the data signal N blocks;

a signal output step of outputting the (N+I) data signal blocks, including the auxiliary blocks appended in the auxiliary signal appending step, by J blocks at a time in a time division fashion successively from those corresponding to higher orders in the corresponding polynomial;

an adding step of calculating, with respect to J data signal blocks outputted in the signal output step and J calculated blocks obtained by a predetermined operation based upon J preceding data signal blocks outputted in the signal output step at a preceding timing, a sum of a pair of the data signal and the calculated blocks corresponding in their orders to each other to produce J sum blocks; and an operating step of carrying out, in response to the J sum blocks calculated in the adding step, the predetermined operation to produce the J calculated blocks which correspond to orders lower by J levels than those of the sum blocks calculated in the adding step and which are respectively added in the adding step at a next timing;

N, K, J, and I being natural numbers where J is a measure of both of (N+I) and K.

DETAILED DESCRIPTION OF THE INVENTION

Now, description will be made about embodiments of this invention with reference to the drawing.

1st Embodiment

Figure 4:
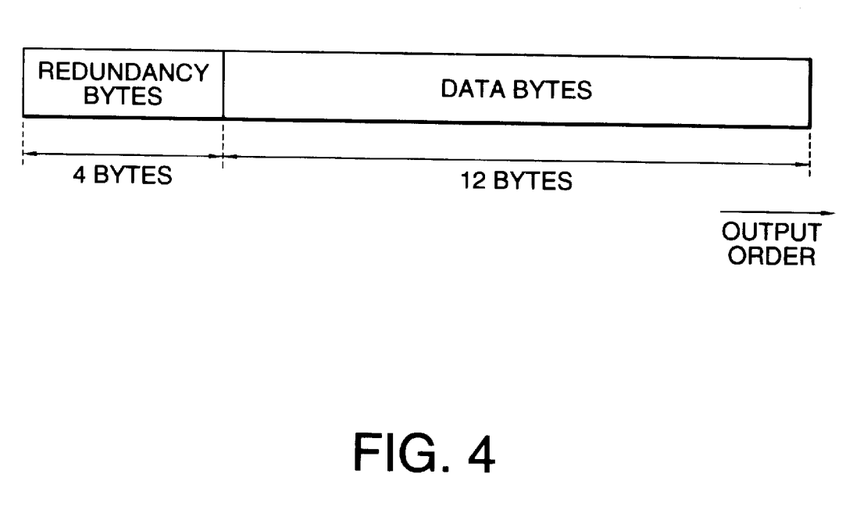
FIG. 4 is a view showing a format of data encoded by Reed-Solomon encoding according to a first embodiment of this invention.

In this embodiment, a (16, 12) Reed-Solomon encoding device which performs parallel processing of two bytes and which can carry out error correction of two bytes will be described for brevity of description. A data format after Reed-Solomon encoding in this embodiment is illustrated in FIG. 4.

At first, description will be made about the principle of the Reed-Solomon encoding in this embodiment.

The Reed-Solomon encoding is executed by the use of a set, called a Galois field, having a predetermined rule. The Galois field is closed within the Galois field for multiplication and addition and thus forms a complete set. Therefore, data having a predetermined bit length (one data block) can be replaced by elements of the Galois field. Let the bit length be represented by N. Then, the Galois field is formed by the elements of 2N or less in number.

In this embodiment, a single block of a signal comprises one byte, i.e., eight bits as will later by described. The Galois field then comprises the elements of 28=256 in number. These elements of the Galois field are expressed as $(0, 1, \alpha, \alpha^2, \alpha^3, \ldots, \alpha^{254})$. These elements correspond to a signal formed by a combination of vector expression of coefficients of a seventh-order polynomial as a remainder obtained by dividing $x^n$ (n=0, 1, ..., 255) by a primitive polynomial G(x) hereunder on a binary operation and zero elements (0, 0, 0, 0, 0, 0, 0, 0).

$$G(x) = x^8 + x^4 + x^3 + x^2 + 1 \tag{2}$$

In n=0 for example, the remainder obtained by dividing $x^n$ by the primitive polynomial G(x) is equal to 1. Therefore, the elements of the Galois field correspond to (0, 0, 0, 0, 0, 0, 0, 1). If n=1, the remainder obtained by dividing $x^n$ by the primitive polynomial (G(x) is equal to x. Then, the elements of the Galois field correspond to (0, 0, 0, 0, 0, 0, 1, 0). If $\alpha^P$ corresponds to $(b_7, b_6, b_5, b_4, b_3, b_2, b_1, b_0)$, the relationship in Equation (3) holds (where each of $b_7$ to $b_0$ is equal to 0 or 1).

$$\alpha^p = \sum_{i=0}^{7} b_i \cdot \alpha^i \tag{3}$$

At this time, each addition is executed as a binary summation per bit. In this embodiment, the addition is carried out by the use of an exclusive OR operation per bit as will later be described. Therefore, the results of addition and subtraction are equivalent. On the other hand, the relationship in Equation (4) holds for multiplication of the elements of the Galois field.

$$\alpha^p \times \alpha^q = \alpha^{(p+q)} \tag{4}$$

From Equations (3) and (4), a product of two given vectors is calculated.

In this embodiment, two bytes of the signal are processed in parallel. Then, consideration will be made about the case where division of quadratic coefficients is processed at a time. To produce the Reed-Solomon code permitting two-byte error correction, a generator polynomial F(x) is a fourth-order polynomial given by Equation (5).

$$F(x) = (x+\alpha)(x+\alpha^2)(x+\alpha^3)(x+\alpha^4) \tag{5}$$

Herein, the Reed-Solomon code is produced for a 12-byte signal. Then, an input code polynomial A(x) is given by Equation (6).

$$A(x) = \sum_{i=4}^{15} a_i \cdot x^{i-4} \quad (6)$$

The coefficient $a_i$ in each term of the input code polynomial A(x) forms an element of the Galois field corresponding to one byte of input data.

This embodiment is directed to double error correction. It is assumed that the quotient and the remainder obtained by dividing by the generator polynomial F(x) a product of the input code polynomial A(x) and $x^{2 \times 2}$. In this event, the relationship given by Equation (7) holds.

$$A(x) \times x^{2 \times 2} = q(x)F(x) + r(x) \quad (7)$$

Herein, the product of the input code polynomial A(x) and $x^{2 \times 2}$ and the generator polynomial F(x) are represented by Equations (8) and (9), respectively.

$$A(x) \cdot x^4 = \sum_{i=4}^{15} a_i \cdot x^i \quad (8)$$

$$F(x) = \sum_{i=0}^{4} g_i \cdot x^i \quad (9)$$

Herein, $g_4 = 1$.

Assuming that F(x)=0, the relationship in Equation (10) holds.

$$x^4 = \sum_{i=0}^{3} g_i \cdot x^i \quad (10)$$

Let Equation (10) be substituted into $A(x) \times x^4$ as shown in Equation (11). As a result, the remainder r(x) as a redundancy byte in the format illustrated in FIG. 4 is obtained.

$$\begin{aligned} A(x) \cdot x^4 &= a_{15} \cdot x^{i+11} \sum_{i=0}^{3} g_i \cdot x^i + \sum_{i=4}^{14} a_i \cdot x^i \quad (11) \\ &= a_{15} \sum_{i=0}^{3} g_i \cdot x^{i+11} + \sum_{i=0}^{14} a_i \cdot x^i \\ &= a_{15} \cdot g_3 \cdot x^{14} + a_{14} \cdot x^{14} + \\ &\quad \sum_{i=0}^{2} (a_{15} \cdot g_i + a_{i+11}) \cdot x^{i+11} + \sum_{i=4}^{10} a_i \cdot x^i \\ &= (a_{15} \cdot g_3 + a_{14}) x^{11} \sum_{i=0}^{3} g_i \cdot x^3 + \\ &\quad (a_{15} \cdot g_3 + a_{i+11}) \cdot x^{i+11} + \sum_{i=4}^{10} a_i \cdot x^i \\ &= \sum_{i=0}^{3} \{(a_{15} \cdot g_3 + a_{14}) g_i + a_{15} \cdot g_{i-1} + a_{i+11})\} \cdot x^{10+i} + \\ &\quad \sum_{i=4}^{9} a_i \cdot x^i \end{aligned}$$

Herein, $g_1 = 0$.

Let $h_i$ be defined as shown in Equation (12). Then, Equation (11) can be rewritten into Equation (13).

$$h_i = g_3 \cdot g_i + g_{i-1} \quad (12)$$

$$A(x) \cdot x^4 = \sum_{i=0}^{3} (a_{15} \cdot h_i + a_{14} \cdot g_i) x^{10+i} + \sum_{i=4}^{15} a_i \cdot x^i \quad (13)$$

Thus, it is possible to lower the order of the input data simultaneously by two levels. This means that the input two-byte data are multiplied by $g_i$ and $h_i$ and resultant products are added to next input data. In this case, $g_i$ and $h_i$ correspond to multipliers of a Galois field multiplication circuit which will later be described. Herein, $h_i$ can be obtained from a coefficient of a remainder polynomial obtained by dividing $x^5$ by the generator polynomial F(x). By the use of $h_i$ obtained from the generator polynomial F(x), it is possible to simultaneously lower the order by two levels and to obtain the remainder r(x).

A transmission code polynomial C(x) upon data transmission through a transmission path is calculated by Equation (14).

$$C(x) = A(x) \times x^{2 \times 2} - r(x) \quad (14)$$

In the similar manner, equations required in circuit formation can be obtained for any number of bytes of the data signal or any number of bytes of the redundancy signal and even if the block comprises any other unit than byte.

Now, the Reed-Solomon encoding device in this embodiment having the structure according to the above-mentioned principle will be described with reference to a block diagram in FIG. 5.

As illustrated in the figure, the Reed-Solomon encoding device comprises a signal separating circuit 100, a counter 1, selectors 2 and 3, exclusive-OR circuits 4 and 5, Galois field multiplication circuits 6 through 13, exclusive-OR circuits 14 through 19, and D flip-flops 20 through 23. The Reed-Solomon encoding device is supplied with an external input signal including clocks and a data signal.

The signal separating circuit 100 is supplied with a single frame (12 bytes) of the data signal. In synchronism with the clocks, the signal separating circuit 100 distributes the input data signal byte by byte in a manner such that one to be a coefficient of a higher-order (odd-numbered) term in an input code polynomial is allotted to a signal B while another to be a coefficient of a lower-order (even-numbered order) term is allotted to a signal A. The signals A and B are successively outputted from a higher-order one in the corresponding input code polynomial. As will later be described, the signal separating circuit 100 outputs the input data signal as the signals A and B when a count value of the counter 1 is between "0" and "5". On the other hand, the signal separating circuit 100 produces "00000000" as the signals A and B when the count value of the counter 1 is "6" or "7" as will later be described.

The counter 1 is an octal counter counted up at every clock input.

The selector 2 is responsive to the count value of the counter 1 and selects as an output either the signal A which is the external input signal or a signal C which is an output signal of the D flip-flop 21. The selector 23 is responsive to the count value of the counter 1 and selects as an output either the signal B which is the external input signal and a signal D which is an output signal of the D flip-flop 23. The selectors 2 and 3 selects as outputs the signals A and B when the count value of the counter 1 is between "0" and "5" and the signal C and D when the count value of the counter 1 is "6" or "7".

For each of the exclusive-OR circuits 4 and 5, the Galois field multiplication circuits 6 through 13, the exclusive-OR circuits 14 through 19, and the D flop-flops 20 through 23, eight similar circuits are arranged in parallel in correspondence to the signal length (1 byte=8 bits) of each of the signals A and B. By the exclusive-OR circuits 4 and 5, the Galois field multiplication circuits 6 through 13, the exclusive-OR circuits 14 through 19, and the D flop-flops 20 through 23, the remainder r(x) described in conjunction with the above-mentioned principle is calculated.

The exclusive-OR circuit 4 executes and exclusive OR operation upon the signals A and C (output signal of the D flip-flop 21) to produce an output signal which is supplied to the Galois field multiplication circuits 6 through 9. The exclusive-OR circuit 5 executes an exclusive OR operation upon the signals B and D (output signal of the D flip-flop 23) per bit to produce an output signal which is supplied to the Galois field multiplication circuits 10 through 13. The operation in each of the exclusive-OR circuits 4 and 5 corresponds to addition of the Galois fields.

The multipliers in the Galois field multiplication circuits 6 through 9 are calculated from coefficients of the generator polynomial F(x) given by Equation (5) and are equal to $\alpha^{10}$, $\alpha^{81}$, $\alpha^{251}$, and $\alpha^{76}$, respectively.

The Galois field multiplication circuits 6 through 9 multiply the output signal of the exclusive-OR circuit 4 by the above-mentioned multipliers to produce output signals.

The multipliers in the Galois field multiplication circuits 10 through 13 are calculated from remainders obtained by dividing $x^5$ by the generator polynomial F(x) and are equal to $\alpha^{86}$, $\alpha^{63}$, $\alpha^{192}$, and $\alpha^{165}$, respectively.

The Galois field multiplication circuits 10 through 13 multiply the output signal of the exclusive-OR circuit 5 by the above-mentioned multipliers to produce output signals.

The exclusive-OR circuit 14 executes an exclusive OR operation upon the output signals of the Galois field multiplication circuits 6 and 10. This corresponds to addition of the Galois fields. An output signal of the exclusive-OR circuit 14 is a coefficient of a lower-order one of even-numbered order terms produced by the operation and is lower in order by four levels than the coefficient of the signal A. The D flip-flop 20 delays the output signal of the exclusive-OR circuit 14 by one clock timing to produce a delayed output signal. Thus, the coefficients and the orders at the next timing (when the count value of the counter 1 proceeds to a next value) are matched with respect to the exclusive-OR circuits 15 and 16.

The exclusive-OR circuit 15 executes an exclusive OR operation upon the output signals of the D flip-flop 20 and the Galois field multiplication circuit 7. The exclusive-OR circuit 16 executes an exclusive OR operation upon the output signals of the exclusive-OR circuit 15 and the Galois field multiplication circuit 10. Each of these operations corresponds to the addition of the Galois fields. An output signal of the exclusive-OR circuit 16 is a coefficient of a higher-order one of even-numbered order terms produced by the operation and is lower in order by two levels than the coefficient of the signal A.

The D flip-flop 21 delays the output signal of the exclusive-OR circuit 16 by one clock timing to produce the signal C which is supplied to the selector 2 and the exclusive-OR circuit 4. The signal C corresponds to a term of an order equal to that of the signal A produced by the signal separating circuit 100 at the same timing. The signal is added to the signal A by the exclusive-OR circuit 4. A coefficient of a term produced during the operation is reflected in the operation of the coefficient of the term lower by two levels.

The exclusive-OR circuit 17 executes an exclusive OR operation upon the output signals of the Galois field multiplication circuits 8 and 12. This corresponds to addition of the Galois fields. An output signal of the exclusive-OR circuit 17 is a coefficient of a lower-order one of odd-numbered order terms produced by the operation and is lower in order by four levels than the coefficient of the signal B. The D flip-flop 22 delays the output signal of the exclusive-OR circuit 17 by one clock timing to produce a delayed output signal. Thus, the coefficients and the orders at the next timing (when the count value of the counter 1 proceeds to a next value) are matched with respect to the exclusive-OR circuits 18 and 19.

The exclusive-OR circuit 18 executes an exclusive OR operation upon the output signals of the D flip-flop 22 and the Galois field multiplication circuit 9. The exclusive-OR circuit 19 executes an exclusive OR operation upon the output signals of the exclusive-OR circuit 18 and the Galois field multiplication circuit 13. Each of these operations corresponds to the addition of the Galois fields. An output signal of the exclusive-OR circuit 19 is a coefficient of a higher-order one of odd-numbered order terms produced by the operation and is lower in order by two levels than the coefficient of the signal B.

The D flip-flop 23 delays the output signal of the exclusive-OR circuit 19 by one clock timing to produce the signal D which is supplied to the selector 3 and the exclusive-OR circuit 5. The signal D corresponds to a term of an order equal to that of the signal B produced by the signal separating circuit 100 at the same timing. The signal is added to the signal B by the exclusive-OR circuit 4. A coefficient of a term produced during the operation is reflected in the operation of the coefficient of the term lower by two levels.

With the above-mentioned structure, the orders of the output signals of the D flip-flops 21 and 23 are lowered by two levels at a time. Those having the second and the third orders when the counter 1 has a value "6" are changed into zeroth-order and first-order ones, respectively, when the counter 1 has a value "7". Thus, the output signals produced by the D flip-flops 21 and 23 when the counter 1 has the value of "6" and "7" are the coefficients of the respective terms of the remainder r(x).

Each of the D flip-flops 20 through 23 is cleared at the output timing of the data signal in the next frame, i.e., at the time instant when the count value of the counter 1 returns from "7" to "0".

Now, description will be made about an operation of the Reed-Solomon encoding device of this embodiment.

In synchronism with the clocks, i.e., in synchronism with the output timing of the signal A and B from the signal separating circuit 100, the counter 1 successively counts "0" to "7". Herein, the signal separating circuit 100 is already supplied with the data signal of a single frame (12 bytes).

When the value of the counter 1 returns from "7" to "0" following the input of the clocks, the D flip-flops 20 through 23 are cleared. Simultaneously, the signal separating circuit 100 produces, as the signals B and A, coefficients a15 and a14 of fifteenth-order and fourteenth-order terms of the product (fifteenth-order polynomial) obtained by multiplying the input code polynomial A(x) corresponding to the data signal by $x^{2 \times 2}$, respectively.

Herein, each of the D flip-flops 20 through 23 is cleared and therefore does not affect the operation at the exclusive-OR circuits 15, 18, 4, and 5. The exclusive-OR circuits 4 and 5 produce the signals A and B as they are, respectively.

A polynomial as a result of dividing the polynomial corresponding to the signal A and B by the generator polynomial F(x) comprises thirteenth-order to tenth-order terms.

The coefficient of the thirteenth-order term is calculated by the Galois field multiplication circuits 9 and 13 and the exclusive-OR circuits 18 and 19 and supplied to the D flip-flop 23. The coefficient of the twelfth-order term is calculated by the Galois field multiplication circuits 7 and 11 and the exclusive-OR circuits 15 and 16 and supplied to the D flip-flop 23. The coefficient of the eleventh-order term is calculated by the Galois field multiplication circuits 8 and 12 and the exclusive-OR circuit 17 and supplied to the D flip-flop 21. The coefficient of the tenth-order term is calculated by the Galois field multiplication circuits 6 and 7 and the exclusive-OR circuit 14 and supplied to the D flip-flop 20.

Next, when the counter has the value "2", the signal separating circuit 100 outputs, as the signal B and A, the coefficients $a_{13}$ and $a_{14}$ of thirteenth-order and fourteenth-order terms of a produce (fifteenth-order polynomial) obtained by multiplying the input code polynomial A(x) corresponding to the data signal by $x^{2\times 2}$, respectively. Herein, the D flip-flops 20 through 23 output the coefficients of tenth-order to thirteenth-order terms of the polynomial produced by the operation when the counter 1 has the value "2".

The exclusive-OR circuit 5 adds the coefficient a13 of the thirteenth-order term of the produce obtained by multiplying the input code polynomial A(x) by $x^{2\times 2}$ and the coefficient of the thirteenth-order term calculated at the preceding timing. The exclusive-OR circuit 4 adds the coefficient $a_{12}$ of the twelfth-order term of the product obtained by multiplying the input code polynomial A(x) by $x^{2\times 2}$ and the coefficient of the twelfth-order term calculated at the preceding timing.

A polynomial as a result of dividing the polynomial corresponding to the signals produced by the exclusive-OR circuits 4 and 5 by the generator polynomial F(x) comprises eleventh-order to eighth-order terms.

The coefficient of the eleventh-order term is calculated by the Galois field multiplication circuits 9 and 13 and the exclusive-OR circuit 19 and is added by the exclusive-OR circuit 18 to the coefficient of the eleventh-order term produced when the counter 1 has the value "0" to be supplied to the D flip-flop 23. The coefficient of the tenth-order term is calculated by the Galois field multiplication circuits 7 and 11 and the exclusive-OR circuits 15 and 16 and is added by the exclusive-OR circuit 15 to the coefficient of the tenth-order term produced when the counter 1 has the value "0" to be supplied to the D flip-flop 23. The coefficient of the ninth-order term is calculated by the Galois field multiplication circuits 8 and 12 and the exclusive-OR circuit 17 and supplied to the D flip-flop 21. The coefficient of the eighth-order term is calculated by the Galois field multiplication circuits 6 and 7 and the exclusive-OR circuit 14 and is supplied to the D flip-flop 20.

Subsequently, similar calculation is repeated. Upon calculation when the counter 1 has the value "5", the D flip-flops 20 through 23 are supplied with the coefficients of the third-order to the zeroth-order terms.

When the counter 1 has the value between "0" and "5", the selectors 2 and 3 select the signals A and B for output as the coefficients of the respective terms of the polynomial obtained by multiplying the input code polynomial A(x) by $x^{2\times 2}$.

When the counter 1 has the value "6", the exclusive-OR circuits 4 and 5 output the coefficients of the second-order and the third-order terms supplied to the D flip-flops 21 and 23 when the counter 1 has the value "5", respectively. At this time, the selectors 2 and 3 select the signals C and D for output as the coefficients of the second-order and the third-order terms of the remainder r(x), respectively. When the counter 1 has the value "7", the selectors 2 and 3 select the signals C and D for output as the coefficients of the zeroth-order and the first-order terms of the remainder r(x).

Supplied with the data signal of 12 bytes and the redundancy signal of 4 bytes outputted from the selectors 2 and 3 by the above-mentioned process, a transmission code polynomial operating circuit (not shown) executes the operation given by Equation (14) to produce a transmission code polynomial C(x). Then, a signal corresponding to the coefficients of the respective terms of the transmission code polynomial is delivered from the transmission code polynomial operating circuit to a transmission line.

As described above, in the Reed-Solomon encoding device of this embodiment, the information separating circuit 100 outputs the data signal as the signals A and B simultaneously by two bytes at a time. The two byte signals are processed in parallel. The redundancy signal is produced by two bytes at a time to be outputted. Therefore, Reed-Solomon encoding is carried out at a speed as high as twice as compared with the conventional Reed-Solomon encoding device. It is therefore possible to process a signal of a twice capacity.

In the above-mentioned first embodiment, description has been directed to the case where the data signal has twelve bytes and the redundancy signal has four bytes. However, the data signal may have any number of bytes up to 252 bytes (but the number of bytes must be an even number). In either event, the number of bytes of the redundancy signal is equal to 4. The counter 1 is of a ((number of bytes of the data signal +4)÷2)-ary type. For example, when the data signal has 252 bytes, the selectors 2 and 3 output the signals A and B, respectively, when the counter 1 has the value between "0" and "125" and the signal C and D when the counter 1 has the value "126" or "127".

In the above-mentioned first embodiment, description has been directed to the Reed-Solomon encoding circuit for executing Reed-Solomon encoding with an error correcting function or two bytes. However, the error correction function of three bytes or more can be achieved in the similar manner. In this event, the counter 1 is of a ((number of bytes of the data signal+number of bytes of the redundancy signal)÷2)-ary type. The selectors 2 and 3 output the signals C and D when the value of the counter is a (number of bytes of the redundancy signal+2)-th one from the last.

In the above-mentioned first embodiment, description has been made about the case where the signal is processed by two bytes in parallel. However, signal processing by three or more bytes in parallel can be achieved in the similar manner. It is noted here that, in case of the signal processing by J bytes in parallel, J must be a measure of both of the number N of bytes of the data signal and the number K of bytes of the redundancy signal. In this case, the Reed-Solomon encoding device is implemented by a circuit structure according to equations modified in the manner similar to the above-mentioned principle.

In the above-mentioned first embodiment, a single block comprises one byte (8 bits) in each of the data signal and the redundancy signal. However, the single block of data in this invention may comprise any desired number of bits. In this case, the elements of the Galois field which correspond to the number of bits of the single block are used as the elements of the input code polynomial A(x).

2nd Embodiment

In the first embodiment, description has been made about the case where the number of bytes of the data signal can be divided without a remainder by the number of the signals separated by the signal separating circuit 0. In contrast, this embodiment is directed to a Reed-Solomon encoding circuit in which a dummy byte is added to the data signal so that a total number of bytes can be divided without a remainder by the number of bytes of the signals separated by the signal separating circuit 0.

Figure 7:
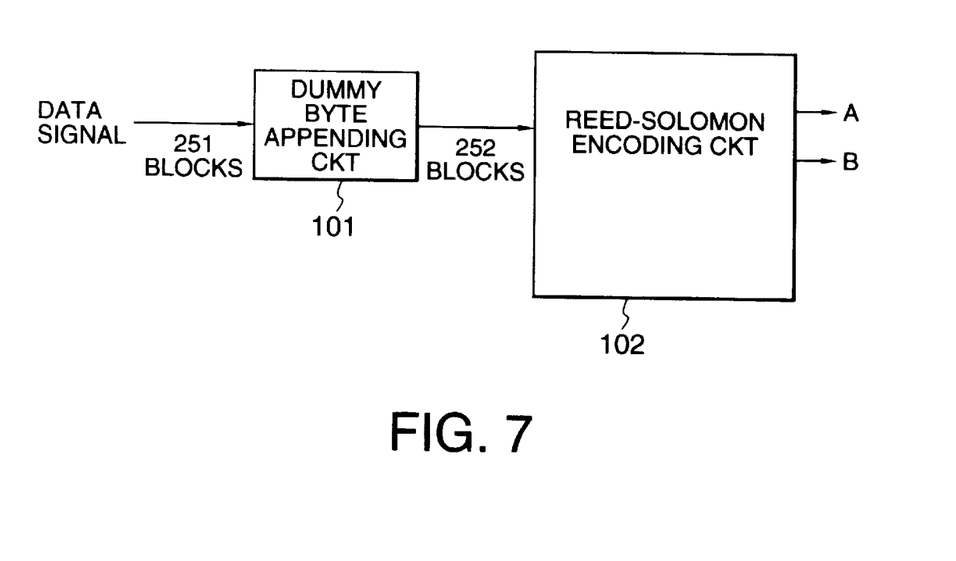
FIG. 7 is a block diagram showing a structure of a Reed-Solomon encoding device according to the second embodiment of this embodiment.

FIG. 7 is a block diagram showing the structure of the Reed-Solomon encoding device according to this embodiment.

As illustrated in the figure, the Reed-Solomon encoding device comprises a dummy byte appending circuit 101 and a Reed-Solomon encoding circuit 102.

The dummy byte appending circuit 102 appends a dummy byte of a single byte to an input data signal in which each single frame comprises 251 bytes, and supplies the signal to the Reed-Solomon encoding circuit 102. Herein, the dummy byte appended to the data signal by the dummy byte appending circuit 102 is "00000000". This dummy byte serves as a highest-order term in the input code polynomial A(x). Therefore, the highest-order term has a coefficient equal to "0" and is not subjected to error correction by a resultant Reed-Solomon code.

Figure 5:
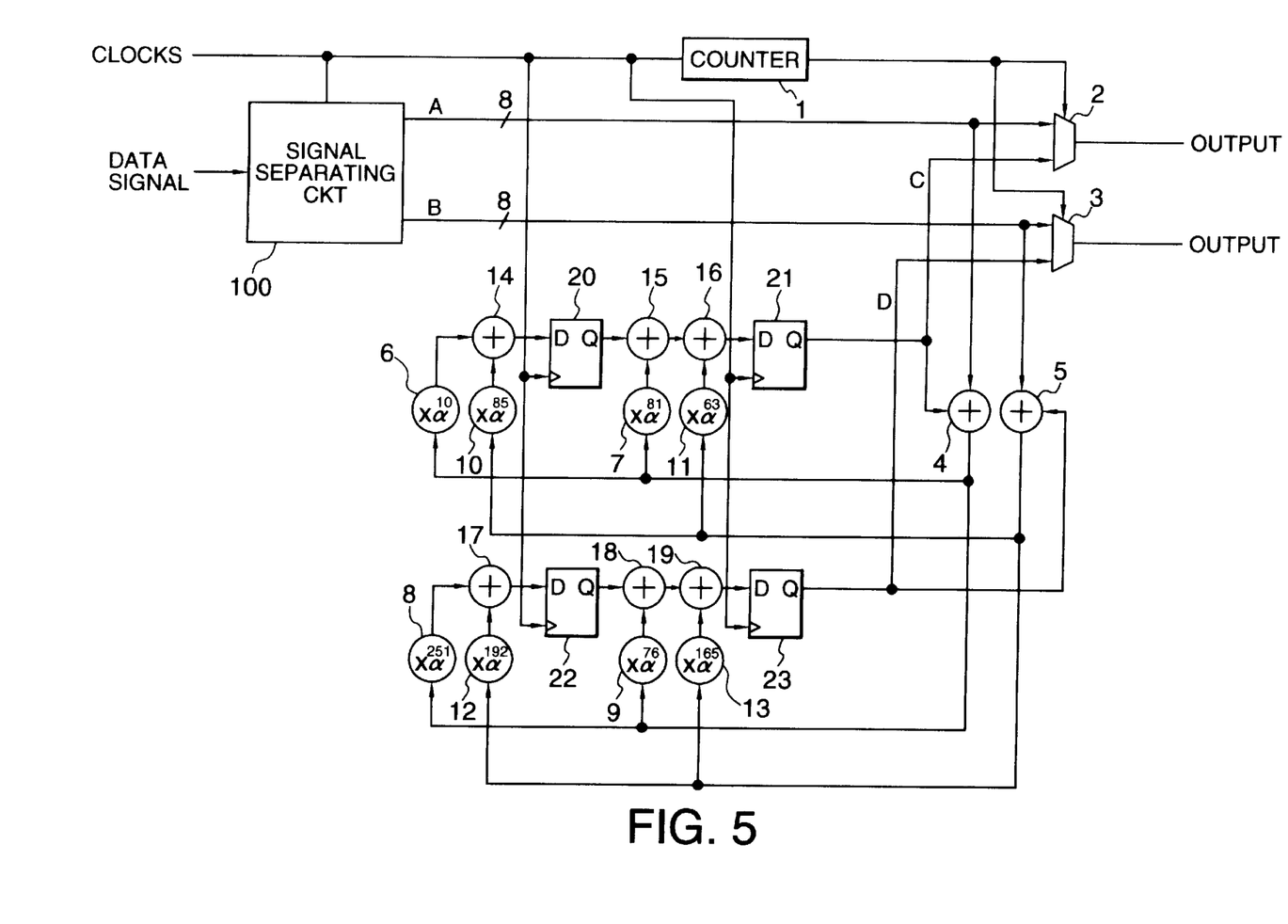
FIG. 5 is a block diagram showing a structure of a Reed-Solomon encoding device according to the first embodiment of this invention.
Figure 6:
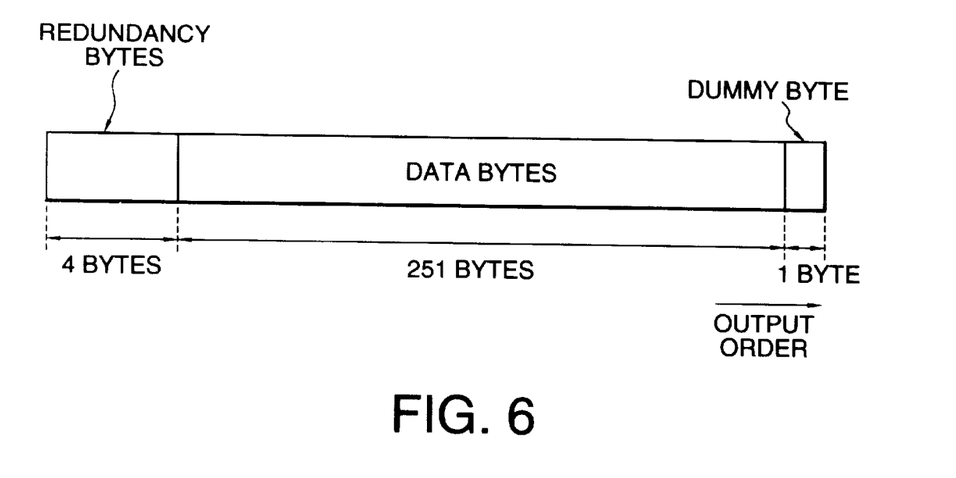
FIG. 6 is a view showing a format of data encoded by Reed-Solomon encoding according to a second embodiment of this invention.

The Reed-Solomon encoding circuit 102 is similar in structure to the Reed-Solomon encoding device illustrated in FIG. 5. However, the counter 1 is of a ((251+4+1)÷2)=128-ary type. The selectors 2 and 3 select and output the signals from the signal separating circuit 100 when the counter 1 has a count value between "0" and "125" and the signals C and D when the count value is "125" or "136".

The signal separating circuit 100 is supplied with the data signal having 252 bits in total including the dummy byte of a single byte. The Reed-Solomon encoding circuit 102 carries out processing similar to that of the first embodiment. In this embodiment, however, the selectors 2 and 3 select and output the signals from the signal separating circuit 100 when the counter 1 has the count value between "0" and "125" and the signals C and D when the count value is 125 or 126.

As described above, the Reed-Solomon encoding device of this embodiment produces the Reed-Solomon code from the data signal with the dummy byte added thereto. Therefore, even if the number of bytes of the data signal can not be divided without a remainder by the number of separated signals produced by the signal separating circuit 100, parallel processing is possible.

In the second embodiment, description has been made about the case where the data signal is separated by the signal separating circuit 100 into two for parallel processing. It is noted here that production of the Reed-Solomon code with the dummy byte added to the data signal is also applicable to the case where the number of the separated signals derived from the data signal is equal to three or more. For example, of the data signal of N bytes is separated into every J bytes for parallel processing, the dummy bytes of I bytes are added where (N+I) is a measure of J (I<J).

As described above, according to this invention, the data signal is processed by J blocks at a time in parallel to produce the redundancy signal by J blocks at a time. Therefore, as compared with the conventional Reed-Solomon encoding device, high-speed processing as high as J times can be carried out. In this Reed-Solomon encoding device, any desired number can be selected as the number N of the blocks of the redundancy signal as far as a predetermined condition is met. Therefore, it is possible to produce the Reed-Solomon code permitting multiple error correction.

An auxiliary signal of I blocks is added to the data signal of N blocks and the redundancy signal is produced for the data signal having (N+I) blocks in total with the auxiliary signal added. Therefore, even if N can not be divided by J without a remainder, it is possible to perform Reed-Solomon encoding by parallel processing.

What is claimed is:

1. A Reed-Solomon encoding device which is supplied with an input signal containing N data signal blocks in each single frame for carrying out a division of dividing by a generator polynomial a polynomial corresponding to said input data signal to produce, as a Reed-Solomon code, K redundancy signal blocks corresponding to a remainder obtained by said division and which comprises:

signal output means for outputting said N data signal blocks by J blocks at a time in a time division fashion successively from those corresponding to higher orders in said corresponding polynomial;

adder means, J in number, for calculating, with respect to J data signal blocks outputted from said signal output means and J calculated blocks obtained by a predetermined operation based upon J preceding data signal blocks outputted from said signal output means at a preceding timing, a sum of a pair of said data signal and said calculated blocks corresponding in their orders to each other;

operating means, J in number, responsive to J sum blocks calculated by said J adder means, respectively, for carrying out the predetermined operation to produce said J calculated blocks which correspond to orders lower by J levels than those of said J sum blocks calculated by said J adder means, respectively, and which are supplied to said J adder means, respectively; and selective output means, J in number, for outputting (N÷J) times J data signal blocks supplied from said signal output means and subsequently outputting (K÷J) times J calculated blocks produced by said J operating means;

N, K, and J being natural number where J is a measure of both of N and K.

2. The Reed-Solomon encoding device according to claim 1, further comprising:

((N+K)÷J)-ary counting means for counting up at an interval equal to that of output timings of said data signal blocks from said signal output means;

said J selective output means successively outputting J data signal blocks supplied from said signal output means when the count value of said counting means is between 0 and (N÷J−1) and successively outputting J calculated blocks produced by said J operating means when the count value of said counting means is between (N÷J) and ((N+K)÷J−1).

3. The Reed-Solomon encoding device according to claim 1, wherein:

each of said J operating means executes the predetermined operation upon coefficients of such terms in the corresponding polynomial that remainders equal to one another are produced when their orders are divided by J;

each of said J adder means calculating, with respect to said calculated blocks as a result of the operation by said J operating means and said J data signal blocks outputted from said signal output means, a sum of a pair of said calculated and said data signal blocks equal in their orders in the corresponding polynomial to each other.

4. The Reed-Solomon encoding device according to claim 3, wherein:

each of said J operating means comprises receiving means for receiving another calculated block which corresponds to the order of said calculated block calculated by this operating means and which is produced as a result of the operation by any operating means other than this operating means, and operating means for carrying out he predetermined operation by the use of the above-mentioned another calculated block received by said receiving means.

5. The Reed-Solomon encoding device according to claim 1, wherein:

said signal output means produces a bit string of "0" when said J selective output means output said J sum blocks as a result of the addition by said J adder means.

6. A Reed-Solomon encoding device which is supplied with an input signal containing N data signal blocks in each single frame for carrying out a division of dividing by a generator polynomial a polynomial corresponding to said input data signal to produce, as a Reed-Solomon code, K redundancy signal blocks corresponding to a remainder obtained by said division and which comprises:

auxiliary block appending means for appending I auxiliary blocks to said N data signal blocks;

signal output means for outputting the (N+I) data signal blocks, including said auxiliary blocks appended by said auxiliary block appending means, by J blocks at a time in a time division fashion successively from those corresponding to higher orders in the corresponding polynomial;

adder means, J in number, for calculating, with respect to J data signal blocks outputted from said signal output means and J calculated blocks obtained by a predetermined operation based upon J preceding data signal blocks outputted from said signal output means at a preceding timing, a sum of a pair of said data signal and said calculated blocks corresponding in their orders to each other;

operating means, J in number, responsive to J sum blocks calculated by said J adder means, respectively, for carrying out the predetermined operation to produce said J calculated blocks which correspond to orders lower by J levels than those of said J sum blocks calculated by said J adder means, respectively, and which are supplied to said J adder means, respectively; and selective output means, J in number, for outputting ((N+I)÷J) times J data signal blocks supplied from said signal output means and subsequently outputting (K÷J) times J calculated blocks produced by said J operating means;

N, K, J, and I being natural numbers where J is a measure of both of (N+1) and K.

7. The Reed-Solomon encoding device according to claim 6, further comprising:

((N+K)÷J)-ary counting means for counting up at an interval equal to that of output timings of said data signal blocks from said signal output means;

said J selective output means successibley outputting J data signal blocks supplied from said signal output means when the count value of said counting means is between 0 and ((N+I)÷J−1) and successively outputting J calculated blocks produced by said J operating means when the count value of said counting means is between ((N+I)÷J) and ((N+I+K)÷J−1).

8. The Reed-Solomon encoding device according to claim 6, wherein:

each of said I auxiliary blocks comprises a bit string of "0";

said signal output means at first outputting said I auxiliary blocks as higher-order ones than said N data signal blocks.

9. The Reed-Solomon encoding device according to claim 6, wherein:

each of said J operating means executes the predetermined operation upon coefficients of such terms in the corresponding polynomial that remainders equal to one another are produced when their orders are divided by J;

each of said J adder means calculating, with respect to said calculated blocks as a result of the operation by said J operating means and said J data signal blocks outputted from said signal output means, a sum of a pair of said calculated and said data signal blocks equal in their orders in the corresponding polynomial to each other.

10. The Reed-Solomon encoding device according to claim 9, wherein:

each of said J operating means comprises receiving means for receiving another calculated block which corresponds to the order of said calculated block calculated by this operating means and which is produced as a result of the operation by any operating means other than this operating means, and operating means for carrying out the predetermined operation by the use of the above-mentioned another calculated block received by said receiving means.

11. The Reed-Solomon encoding device according to claim 6, wherein:

said signal output means produces a bit string of "0" when said J selective output means output said J sum blocks as a result of the addition by said J adder means.

12. A Reed-Solomon encoding method which is supplied with an input signal containing N data signal blocks in each single frame for carrying out a division of dividing by a generator polynomial a polynomial corresponding to said input data signal to produce, as a Reed-Solomon code, K redundancy signal blocks corresponding to a remainder obtained by said division;

said method comprising:

a signal output step of outputting said N data signal blocks by J blocks at a time in a time division fashion successively from those corresponding to higher orders in the corresponding polynomial;

an adding step of calculating, with respect to J data signal blocks outputted in said signal output step and J calculated blocks obtained by a predetermined operation based upon J preceding data signal blocks outputted in said signal output step at a preceding timing, a sum of a pair of said data signal and said calculated blocks corresponding in their orders to each other to produce J sum blocks; and an operating step of carrying out, in response to said J sum blocks calculated in said adding step, the predetermined operation to produce said J calculated blocks which correspond to orders lower by J levels than those of said sum blocks calculated in said adding step and which are respectively added in said adding step at a next timing;

N, K, and J being natural numbers where J is a measure of both of N and K.

13. A Reed-Solomon encoding method which is supplied with an input signal containing N data signal blocks in each single frame for carrying out a division of dividing by a generator polynomial a polynomial corresponding to said input data signal to produce, as a Reed-Solomon code, K redundancy signal blocks corresponding to a remainder obtained by said division;

said method comprising:
an auxiliary signal appending step of appending I auxiliary blocks to said N data signal blocks;
a signal output step of outputting the (N+I) data signal blocks, including said auxiliary blocks appended in said auxiliary signal appending step, by J blocks at a time in a time division fashion successively from those corresponding to higher order sin the corresponding polynomial;
an adding step of calculating, with respect to J data signal blocks outputted in said signal output step and J calculated blocks obtained by a predetermined operation based upon J preceding data signal blocks outputted in said signal output step at a preceding timing, a sum of a pair of said data signal and said calculated blocks corresponding in their orders to each other to produce J sum blocks; and
an operating step of carrying out, in response to said J sum blocks calculated in said adding step, the predetermined operation to produce said J calculated blocks which correspond to orders lower by J levels than those of said sum blocks calculated in said adding step and which are respectively added in said adding step at a next timing;
N, K, J, and I being natural numbers where J is a measure of both of (N+I) and K.

\* \* \* \* \*